United States Patent
Kawanabe et al.

(10) Patent No.: US 12,108,573 B2
(45) Date of Patent: Oct. 1, 2024

(54) ELECTRONIC CONTROL DEVICE WITH HEAT-DISSIPATING MEMBERS AND SUPPORTING MEMBERS

(71) Applicant: KUBOTA CORPORATION, Osaka (JP)

(72) Inventors: Motohiro Kawanabe, Sakai (JP); Koji Nakakita, Sakai (JP); Kenji Nishioka, Sakai (JP); Misaki Yamada, Sakai (JP)

(73) Assignee: KUBOTA CORPORATION, Osaka (JP)

( * ) Notice: Subject to any disclaimer, the term of this patent is extended or adjusted under 35 U.S.C. 154(b) by 211 days.

(21) Appl. No.: 17/786,454

(22) PCT Filed: Mar. 9, 2021

(86) PCT No.: PCT/JP2021/009370
§ 371 (c)(1),
(2) Date: Jun. 16, 2022

(87) PCT Pub. No.: WO2021/187249
PCT Pub. Date: Sep. 23, 2021

(65) Prior Publication Data
US 2023/0030412 A1   Feb. 2, 2023

(30) Foreign Application Priority Data
Mar. 17, 2020   (JP) .................. 2020-046228

(51) Int. Cl.
*H05K 7/20*   (2006.01)
*H05K 5/00*   (2006.01)
*H05K 5/04*   (2006.01)

(52) U.S. Cl.
CPC ......... *H05K 7/2039* (2013.01); *H05K 5/0047* (2013.01); *H05K 5/04* (2013.01);
(Continued)

(58) Field of Classification Search
CPC ............ H05K 7/2039; H05K 7/20436; H05K 7/20445; H05K 7/20454; H05K 7/20845;
(Continued)

(56) References Cited

U.S. PATENT DOCUMENTS

| | | | |
|---|---|---|---|
| 8,520,397 B2 * | 8/2013 | Azumi | ................. H05K 5/0069 361/752 |
| 2003/0117776 A1 * | 6/2003 | Katsuro | ............. H05K 7/20854 361/705 |

(Continued)

FOREIGN PATENT DOCUMENTS

| | | |
|---|---|---|
| DE | 102011088292 A1 | 6/2012 |
| EP | 0449640 A1 | 10/1991 |

(Continued)

OTHER PUBLICATIONS

Machine translation completed Mar. 6, 2024, JP 2014/099550-A by Noguchi et al. (Year: 2024).*

Primary Examiner — Mandeep S Buttar
Assistant Examiner — Steven Ngo
(74) Attorney, Agent, or Firm — Muncy, Geissler, Olds & Lowe, P.C.

(57) ABSTRACT

An electronic control device 1 includes: a circuit board 4 having a first surface 4A on which heat-generating components 21, 22, 23 and heat-degradable components 31, 32 are mounted; a first metallic case 2 covering the first surface 4A; a second case 3 covering a second surface 4B of the circuit board 4 opposite to the first surface 4A; supporting members 51, 52 provided between the heat-degradable components 31, 32 and the first case 2 to support the heat-degradable components 31, 32; and heat-dissipating members 41, 42, 43, each provided on at least any of the heat-generating components 21, 22, 23, and the first case 2, to transmit heat generated from the heat-generating component 21, 22, or 23, (Continued)

to the first case 2. A heat conductivity of the heat-dissipating members 41, 42, 43 is higher than a heat conductivity of the supporting members 51, 52.

6 Claims, 3 Drawing Sheets

(52) U.S. Cl.
CPC ..... *H05K 7/20436* (2013.01); *H05K 7/20854* (2013.01); *H05K 5/0056* (2013.01); *H05K 5/006* (2013.01)

(58) Field of Classification Search
CPC .. H05K 7/20854; H05K 7/2089; H05K 7/209; H05K 5/0026; H05K 5/0047; H05K 5/04; H05K 5/0056; H05K 5/006; H05K 5/0091
See application file for complete search history.

(56) References Cited

U.S. PATENT DOCUMENTS

| | | | | |
|---|---|---|---|---|
| 2006/0043551 | A1* | 3/2006 | Yamauchi | H01L 23/3737 257/E23.105 |
| 2010/0254093 | A1* | 10/2010 | Oota | B60R 16/0239 361/720 |
| 2011/0013370 | A1* | 1/2011 | Oota | H01L 25/16 361/752 |
| 2011/0292624 | A1* | 12/2011 | Tanaka | H05K 5/0052 361/752 |
| 2015/0189734 | A1* | 7/2015 | Nishimoto | H05K 3/3415 361/720 |
| 2016/0295745 | A1* | 10/2016 | Nishimoto | H05K 7/20845 |
| 2018/0007778 | A1* | 1/2018 | Ito | C09D 5/00 |
| 2019/0160316 | A1* | 5/2019 | Counts | A62C 37/08 |
| 2019/0276072 | A1* | 9/2019 | Morimoto | H01G 9/06 |
| 2019/0299881 | A1* | 10/2019 | Saito | H05K 5/062 |
| 2021/0195767 | A1* | 6/2021 | Kaneko | H01L 23/3121 |

FOREIGN PATENT DOCUMENTS

| | | | |
|---|---|---|---|
| JP | H02-194596 A | | 8/1990 |
| JP | 3-278596 A | | 12/1991 |
| JP | 2004-259948 A | | 9/2004 |
| JP | 2005-129820 A | | 5/2005 |
| JP | 2014-99550 A | | 5/2014 |
| JP | 2014099550 A | * | 5/2014 |
| JP | 2015-198168 A | | 11/2015 |

* cited by examiner

G – G

ELECTRONIC CONTROL DEVICE WITH HEAT-DISSIPATING MEMBERS AND SUPPORTING MEMBERS

TECHNICAL FIELD

The present invention relates to an electronic control device including a circuit board on which a heat-generating component and a heat-degradable component are mounted.

BACKGROUND ART

For example, an in-vehicle electronic control device includes a circuit board. To meet various mounting conditions, a circuit board of this type is required to have high heat resistance and vibration resistance. On the circuit board, a heat-generating component that generates heat during operation and a component that requires vibration countermeasures in consideration of vibration of a vehicle are mounted in mixed relation.

As one of means for improving the heat resistance of the heat-generating component, it has been known to, e.g., fix the circuit board to a metallic housing and efficiently transmit heat generated from the heat-generating component to the metallic housing via a heat-dissipating member to diffuse the heat therein. In addition, the component that requires vibration countermeasures has a size mainly larger in a height direction. Accordingly, as one of means for improving the vibration resistance of the component that requires vibration countermeasures, it has been known to, e.g., support, with respect to the metallic housing, the component that requires vibration countermeasures at a position as distant as possible from a position at which the component that requires vibration countermeasures is connected by soldering to the circuit board.

PTL 1 discloses a circuit board of an electronic device. A container case of the electronic device described in PTL 1 is internally filled with a heat-dissipating resin for heat dissipation. A leading end portion of a heat-generating component on the circuit board is buried in the heat-dissipating resin in the container case. Accordingly, heat generated from the heat-generating component is transmitted to the container case through the heat-dissipating resin to be diffused therein. In addition, a leading end portion of a low-heat-generating component described in PTL 1 is buried in the heat-dissipating resin in the container case via a protective cap made of an elastic member. Thus, the protective cap keeps the heat generated from the heat-generating component from being transmitted to the low-heat-generating component via the heat-dissipating resin.

CITATION LIST

Patent Literature

[PTL 1] Japanese Patent Application Publication No. 2014-99550

SUMMARY OF INVENTION

Technical Problem

Note that examples of the component that requires vibration countermeasures include a component that undergoes heat degradation such as, e.g., an electrolytic capacitor. As a result, when the component that requires vibration countermeasures is supported with respect to the metallic housing as the means for improving the vibration resistance of the component that requires vibration countermeasures, the heat generated from the heat-generating component may be transmitted via the metallic housing to a component (such as, e.g., an electrolytic capacitor) that undergoes heat degradation among the components that require vibration countermeasures. This may undesirably accelerate the heat degradation of the component that undergoes heat degradation among the components that require vibration countermeasures.

The present invention has been achieved in order to solve the problem described above, and an object thereof is to provide an electronic control device that can suppress heat degradation of a heat-degradable component that requires vibration countermeasures and also undergoes heat degradation, while improving vibration resistance of the heat-degradable component.

Solution to Problem

The problem described above is solved by an electronic control device according to the present invention including: a circuit board having a first surface on which a heat-generating component that generates heat during operation and a heat-degradable component that requires vibration countermeasures and also undergoes heat degradation are mounted; a first metallic case covering the first surface; a second case covering a second surface of the circuit board opposite to the first surface; a supporting member provided between the heat-degradable component and the first case to support the heat-degradable component; and a heat-dissipating member provided on at least either of the heat-generating component and the first case to transmit the heat generated from the heat-generating component to the first case, a heat conductivity of the heat-dissipating member being higher than a heat conductivity of the supporting member.

In the electronic control device according to the present invention, the heat-degradable component that requires vibration countermeasures and also undergoes heat degradation is supported by the supporting member provided between the heat-degradable component and the first case. The heat generated from the heat-generating component is transmitted to the metallic first case via the heat-dissipating member provided on at least either of the heat-generating component and the first case to be diffused therein. It is to be noted herein that the heat conductivity of the heat-dissipating member is higher than the heat conductivity of the supporting member. Accordingly, even when the heat generated from the heat-generating component is transmitted via the heat-dissipating member to the metallic first case to be diffused therein, the supporting member can suppress the heat transmitted to the first case from being transmitted to the heat-degradable component and also support the heat-degradable component. This allows the electronic control device according to the present invention to suppress the heat degradation of the heat-degradable component that requires vibration countermeasures and also undergoes heat degradation, while improving vibration resistance of the heat-degradable component.

It is preferable that, in the electronic control device according to the present invention, the supporting member is disposed between the heat-degradable component and the first case.

In the electronic control device according to the present invention, the supporting member is disposed between the heat-degradable component and the first case. Therefore, the supporting member can more reliably suppress the heat diffused into the first case from being transmitted to the heat-degradable component that requires vibration countermeasures and also undergoes heat degradation and more reliably suppress the heat degradation of the heat-degradable component, while securely supporting the heat-degradable component by using the first case.

It is preferable that, in the electronic control device according to the present invention, the heat-dissipating member is provided to be interposed between the heat-generating component and the first case.

In the electronic control device according to the present invention, the heat-dissipating member is provided to be interposed between the heat-generating component and the first case. Therefore, the heat-dissipating member can allow the heat generated from the heat-generating component during operation to be more reliably transmitted to the first case and more reliably dissipate the heat from the heat-generating component.

It is preferable that the electronic control device according to the present invention further includes: a sealing agent disposed between the first case and the second case to bond the first case and the second case together and liquid-tightly seal the circuit board between the first case and the second case, wherein a material of the sealing agent is the same as a material of the supporting member.

In the electronic control device according to the present invention, the material of the sealing agent liquid-tightly sealing the circuit board between the first case and the second case is the same as the material of the supporting member. Therefore, it is possible to reduce the types of the members to unify the types of the members, and simplify a process of producing the electronic control device.

It is preferable that, in the electronic control device according to the present invention, the heat-generating component is a first heat-generating component, and the heat-dissipating member is a first heat-dissipating member, and the electronic control device further includes: a second heat-generating component mounted on the second surface to generate heat during operation; and a second heat-dissipating member additionally provided on the second heat-generating component to dissipate heat generated from the second heat-generating component.

In the electronic control device according to the present invention, the heat generated from the second heat-generating component mounted on the second surface of the circuit board is transmitted to the circuit board and the first case via the second heat-dissipating member additionally provided on the second heat-generating component to be diffused therein or diffused by radiation via the second heat-dissipating member. As a result, even when the heat-generating component is mounted on each of the first and second surfaces of the circuit board, it is possible to efficiently dissipate the heat generated from the heat-generating component.

It is preferable that, in the electronic control device according to the present invention, the circuit board is used to control operation of an engine of a vehicle, and the first case is attached to at least either of the engine and a vehicle body in which the engine is mounted.

When the electronic control device according to the present invention is attached to at least either of the engine of the vehicle and the vehicle body in which the engine is mounted, the electronic control device can suppress the heat degradation of the heat-degradable component that requires vibration countermeasures and also undergoes heat degradation, while improving the vibration resistance of the heat-degradable component. As a result, it is possible to improve durability and reliability of the in-vehicle electronic control device.

It is preferable that, in the electronic control device according to the present invention, the first case is attached using a fastening member to at least either of the engine and the vehicle body to have a surface thereof brought into contact with a surface of at least either of the engine and the vehicle body.

In the electronic control device according to the present invention, the first case is attached using the fastening member to at least either of the engine and the vehicle body and has the surface thereof brought into contact with the surface of at least either of the engine and the vehicle body. As a result, it is possible efficiently transmit, from the first case to at least either of the engine and the vehicle body, the heat transmitted from the heat-generating component to the first case via the heat-dissipating member and dissipate the heat. In addition, since the electronic control device is stably attached to at least either of the engine and the vehicle body by using the surface of the first case, it is possible to reduce vibration of the electronic control device.

Advantageous Effects of Invention

According to the present invention, it is possible to provide an electronic control device that can suppress heat degradation of a heat-degradable component that requires vibration countermeasures and also undergoes heat degradation, while improving vibration resistance of the heat-degradable component.

DESCRIPTION OF EMBODIMENTS

Figure 1:
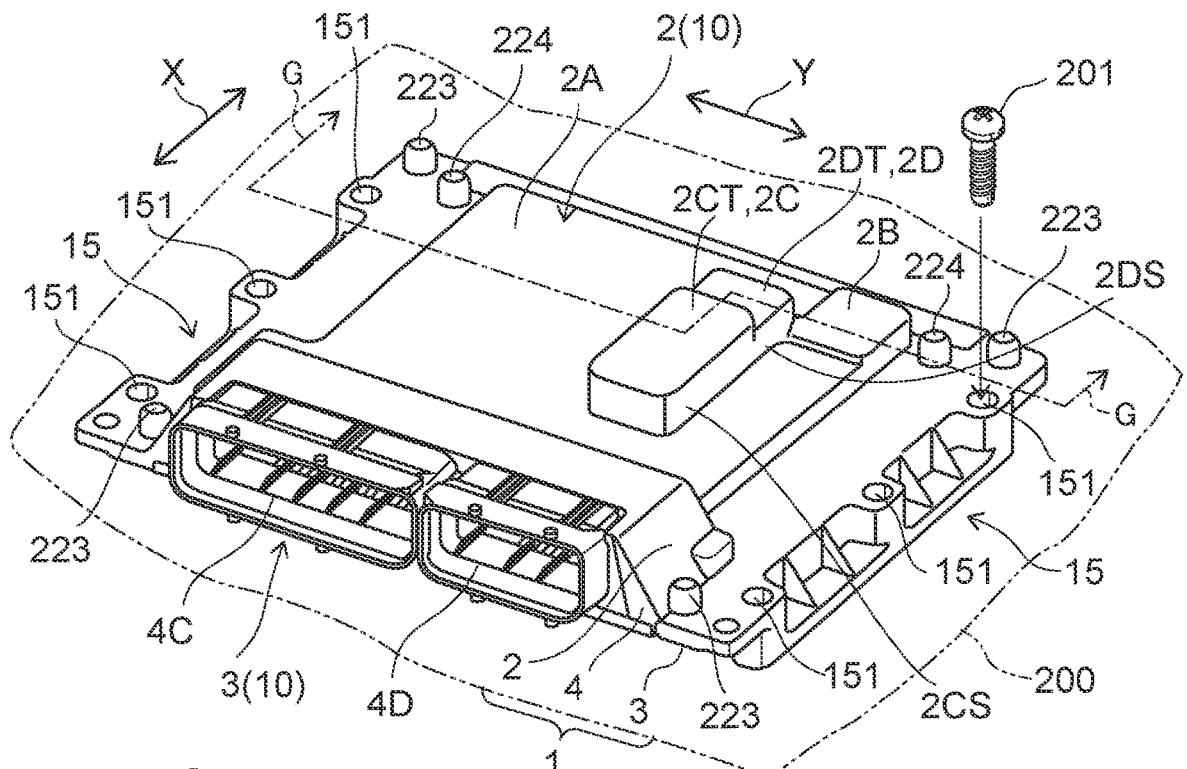
FIG. 1 is a perspective view illustrating an electronic control device according to an embodiment of the present invention.

Referring to the drawings, a preferred embodiment of the present invention will be described below in detail.

Note that the embodiment described below is a preferred specific example of the present invention, and various technically preferable limitations are given thereto. However, the scope of the present invention is not limited to such an embodiment unless there is a specific statement to limit the present invention in the following description. In the individual drawings, the same components are given the same reference signs, and a detailed description thereof is omitted as appropriate.

(Outline of Electronic Control Device 1 and Mounting Object)

FIG. 1 is a perspective view illustrating an electronic control device according to an embodiment of the present invention.

Figure 2:
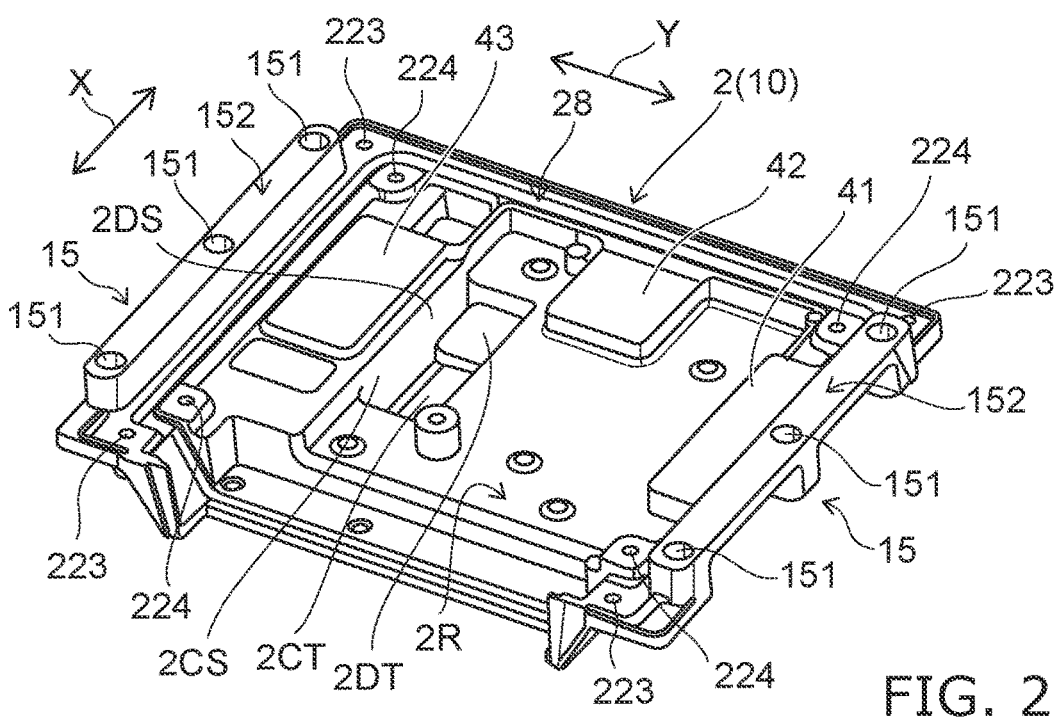
FIG. 2 is a perspective view illustrating an upper case of the electronic control device according to the present embodiment.

FIG. 2 is a perspective view illustrating an upper case of the electronic control device according to the present embodiment.

Note that FIG. 2 illustrates an inner surface (back surface) side of the upper case.

An electronic control device 1 illustrated in FIG. 1 is used as, e.g., an in-vehicle electronic control device. The electronic control device 1 to be used for an in-vehicle application is an engine control unit (ECU), and generally controls an electrical auxiliary device to be used when, e.g., drive control, safety control, or the like for an engine is performed.

The engine to which the electronic control device 1 is applied is, e.g., an internal combustion engine. An engine of this type is mounted in a vehicle such as, e.g., a construction machine, a farm machine, a lawn mower, or an automobile or the like. The engine is, e.g., a supercharged diesel engine with a turbo-charger. However, the engine is not limited thereto, and may also be a naturally aspired diesel engine, a supercharged gasoline engine with a turbo-charger, a naturally aspired gasoline engine, or a hybrid diesel engine or a hybrid gasoline engine using an electric motor in combination. The electronic control device 1 illustrated in FIG. 1 is attached to, e.g., a vehicle body of a vehicle or the engine. Using a plurality of bolts 201, the electronic control device 1 is removably attached to a mounting object 200 such as the vehicle body or engine. Examples of the mounting object 200 include a member in an engine room of the vehicle body of the vehicle, a member in a cabin of a driver seat, the engine, and the like.

As illustrated in FIGS. 1 and 2, in, e.g., a plurality of portions of an upper case 2, bolt through holes 151 are provided. The bolts 201 illustrated in FIG. 1 are fitted into the mounting object 200 through the individual bolt through holes 151 to allow the electronic control device 1 to be removably attached to the mounting object 200. The bolts 201 in the present embodiment are an example of a "fastening member" in the present embodiment.

(Example of Configuration of Electronic Control Device 1)

Figure 3:
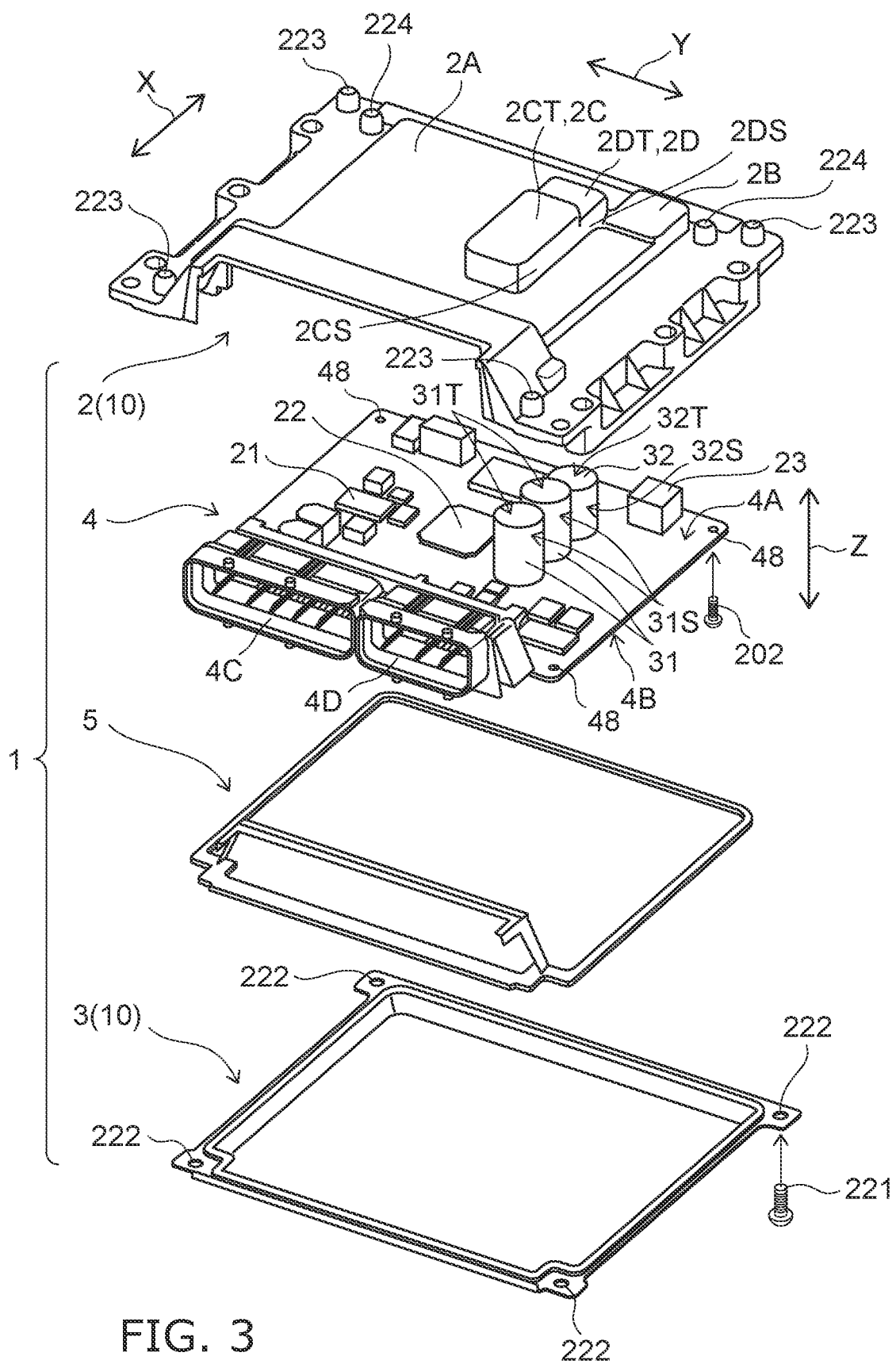
FIG. 3 is an exploded perspective view illustrating an example of a configuration of the electronic control device according to the present embodiment.

FIG. 3 is an exploded perspective view illustrating an example of a configuration of the electronic control device according to the present embodiment.

Figure 4:
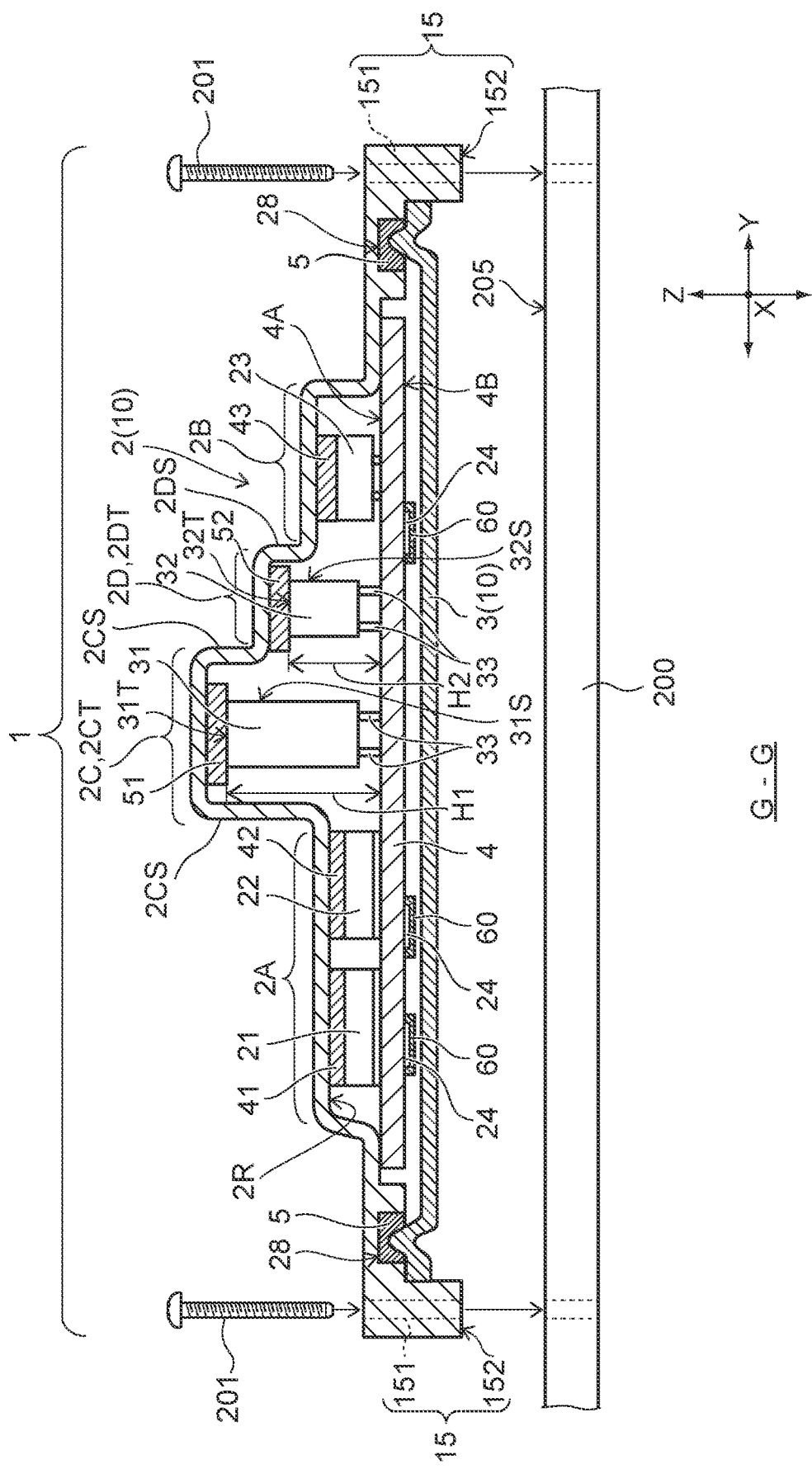
FIG. 4 is a cross-sectional view along a cut plane G-G line illustrated in FIG. 1.

FIG. 4 is a cross-sectional view along a cut plane G-G line illustrated in FIG. 1.

Note that, in FIG. 4, for easier understanding of the example of the configuration of the electronic control device 1, components of the electronic control device 1 and the like are schematically illustrated in a partially emphasized manner.

As illustrated in FIG. 3, the electronic control device 1 includes the upper case 2, a lower case 3, an electronic control substrate 4, and a sealing agent 5. The electronic control substrate 4 in the present embodiment is an example of a "circuit board" in the present invention. The upper case 2 in the present embodiment is an example of a "first case" in the present invention. The lower case 3 in the present embodiment is an example of a "second case" in the present invention. The upper case 2 and the lower case 3 use the sealing agent 5 to contain therein the electronic control substrate 4 in a liquid-tightly sealed or hermetically sealed state, and are fastened together using a plurality of bolts 221 illustrated in FIG. 3. The upper case 2 and the lower case 3 are included in a metallic housing 10. Thus, the upper case 2 and the lower case 3 of the housing 10 ensure each of functions required of the in-vehicle electronic control device 1, such as heat dissipation, dust-proofness, water-proofness, vibration resistance, and heat resistance.

Next, a description will be given of the upper case 2 and the lower case 3.

<Upper Case 2>

The upper case 2 illustrated in FIGS. 2 and 3, which is required to dissipate heat generated in the electronic control device 1, is a metallic housing having heat dissipation, and is molded by, e.g., aluminum die-casting. The upper case 2 has an uneven three-dimensional shape to correspond to respective shapes of various electronic components mounted on the electronic control substrate 4.

As illustrated in FIG. 2, the upper case 2 has female screw portions 224. The female screw portions 224 are formed with female screws into which the bolts 202 (see FIG. 3) are to be fitted. As also illustrated in FIG. 3, at four corner positions of the electronic control substrate 4, bolt through holes 48 are formed to allow the bolts 202 to pass therethrough. The bolts 202 are fitted into the female screw portions 224 of the upper case 2 through the bolt through holes 48 of the electronic control substrate 4 to thereby fix the electronic control substrate 4 to the upper case 2. Thus, the upper case 2 fixes the electronic control substrate 4 and covers a first surface 4A of the electronic control substrate 4 on which the various electronic components are mounted. Note that a form in which the electronic control substrate 4 is held is not limited thereto. For example, the electronic control substrate 4 may also be held between the upper case 2 and the lower case 3 without relying on the fastening member such as the bolts 202.

As illustrated in FIGS. 1 to 3, the upper case 2 has female screw portions 223. In the female screw portions 223, female screws into which the bolts 221 (see FIG. 3) are to be fitted are formed. As also illustrated in FIG. 3, at four corner positions of the lower case 3, bolt through holes 222 are formed to allow the bolts 221 to pass therethrough. The bolts 221 are fitted into the female screw portions 223 of the upper case 2 through the bolt through holes 222 in the lower case 3 to thereby fix the lower case 3 to the upper case 2. Thus, the lower case 3 is fixed to the upper case 2 to cover a second surface 4B of the electronic control substrate 4 opposite to the first surface 4A of the electronic control substrate 4.

The upper case 2 has attached portions 15 at both end portions thereof in a Y-direction. The attached portions 15 are portions to be attached to the mounting object 200 via the bolts 201. The bolt through holes 151 extend through the attached portions 15 in a Z-direction (height direction). As described above, the bolts 201 are fitted into the mounting object 200 through the bolt through holes 151 to thereby attach the electronic control device 1 to the mounting object 200. As illustrated in FIG. 4, when the electronic control device 1 is fastened using the bolts 201 to the mounting object 200, respective surfaces 152 of the attached portions 15 are brought into contact with a surface 205 of the mounting object 200 to occupy a relatively wide area. As a result, the electronic control device 1 is stably attached to the mounting object 200. This can reduce vibration of the electronic control device 1. Note that details, such as a shape of the upper case 2, will be described later.

<Lower Case 3>

The lower case 3 illustrated in FIG. 3 is made of a metal plate of, e.g., iron, aluminum, or the like. Alternatively, the lower case 3 may also be formed of a resin. The lower case 3 need not necessarily be formed of a material having heat dissipation, and may also be formed of a non-heat-dissipating material. This allows the lower case 3 to be formed by press working of a low-cost metal plate. Thus, to produce the lower case 3, aluminum die-casting need not be used, and accordingly the lower case 3 can be reduced in cost. The lower case 3 is a substantially flat plate-like member which is less uneven than the upper case 2. This results in a relatively simplified structure of the lower case 3. In addition, as described above, the lower case 3 is fixed using the bolts 221 to the upper case 2 to cover the second surface 4B of the electronic control substrate 4. As a result, using the sealing agent 5, the upper case 2 and the lower case 3 contain therein the electronic control substrate 4 in the liquid-tightly sealed or hermetically sealed state. A dimension of the lower case 3 in an X-direction as a vertical direction thereof is substantially the same as a dimension of the upper case 2 in the X-direction. A dimension of the lower case 3 in the Y-direction as a lateral direction thereof is substantially the same as a dimension of the upper case 2 in the Y-direction.

<Electronic Control Substrate 4>

Referring to FIGS. 3 and 4, an example of a configuration of the electronic control substrate 4 will be described. The electronic control substrate 4 illustrated in FIGS. 3 and 4 is required to have, e.g., high heat resistance and high vibration resistance to meet various mounting conditions and use environment conditions. As illustrated in FIGS. 1 and 3, the electronic control substrate 4 has, e.g., two connectors 4C and 4D. The connectors 4C and 4D are electrically connected to, e.g., connectors of a harness on a vehicle body side to receive a power supply and transmit/receive a control signal.

On the electronic control substrate 4 illustrated by way of example in FIGS. 3 and 4, heat-generating components that generate heat during operation and components that require vibration countermeasures in consideration of vibration of the vehicle body of the vehicle are mounted in mixed relation. The "heat-generating components" are electronic components that generate heat when being operated by energization, which are components that may undergo functional deterioration or the like without heat dissipation. Examples of the heat-generating components include a coil, an LSI (large-scale integrated circuit), a semiconductor element such as a microcomputer, and the like.

Accordingly, to allow heat generated from heat-generating components 21, 22, and 23 illustrated in FIG. 4 to be efficiently diffused using the upper case 2 of the housing 10 and dissipated to external air, the electronic control device 1 according to the present embodiment has a heat-dissipating structure portion as described below. Specifically, as illustrated in FIG. 4, the upper case 2 is provided with a heat-dissipating region portion 2A and a heat-dissipating region portion 2B. To an inner surface 2R of the upper case 2 corresponding to a position of the heat-dissipating region portion 2A, heat-dissipating members 41 and 42 are applied or stuck. Also, to the inner surface 2R of the upper case 2 corresponding to a position of the heat-dissipating region portion 2B, a heat-dissipating member 43 is applied or stuck. Note that the heat-dissipating members 41, 42, and 43 may also be applied or stuck to the respective heat-generating components 21, 22, and 23 or may also be applied or stuck to both of the respective heat-generating components 21, 22, and 23 and the inner surface 2R of the upper case 2. The heat-generating components 21, 22, and 23 in the present embodiment are an example of a "first heat-generating component" in the present invention. The heat-dissipating members 41, 42, and 43 in the present embodiment are examples of a "first heat-dissipating component" in the present invention.

The heat-dissipating members 41 and 42 are brought into close contact with respective upper surfaces of the heat-generating components 21 and 22 and provided to be interposed between the respective upper surfaces of the heat-generating components 21 and 22 and the inner surface 2R of the upper case 2 in the heat-dissipating region portion 2A. Likewise, the heat-dissipating member 43 is brought into close contact with an upper surface of the heat-generating component 23 and provided to be interposed between the upper surface of the heat-generating component 23 and the inner surface 2R of the upper case 2 in the heat-dissipating region portion 2B. As a result, the heat generated from the heat-generating components 21, 22, and 23 during operation is efficiently transmitted to the metallic upper case 2 through the heat-dissipating members 41, 42, and 43 to be diffused and dissipated to the outside.

The heat-dissipating members 41, 42, and 43 are formed of a material having a relatively high heat conductivity of, e.g., not less than about 2.2 W/m·K and not more than about 2.8 W/m·K. A form of each of the heat-dissipating members 41, 42, and 43 is not particularly limited, and may also be any of a sheet type, a tape type, a gel type, a rubber type, a putty type, a compound type, and the like. Note that the heat conductivity of the heat-dissipating members 41, 42, and 43 is not limited to a value of not less than 2.2 W/m·K and not more than 2.8 W/m·K.

Examples of the component that requires vibration countermeasures include a component having a component size which is relatively high mainly in the Z-direction (height direction), such as an electrolytic capacitor. In other words, the component that requires vibration countermeasures is a component having a relatively large height. Accordingly, when the component that requires vibration countermeasures receives vibration of the electronic control device 1 due to disturbance, a posture of the component that requires vibration countermeasures may change in the housing 10 or soldered portions of the component that requires vibration countermeasures and the electronic control substrate 4 may come apart. Examples of the component that requires vibration countermeasures also include an electronic component (heat-degradable component) that undergoes heat degradation such as an electrolytic capacitor.

More specifically, heat-degradable components 31 and 32 among the components that require vibration countermeasures have thin electrically connected terminals 33, as illustrated in FIG. 4. The electrically connected terminals 33 are electrically connected by soldering to a conductive pattern portion of an electronic circuit of the electronic control substrate 4. The heat-degradable components 31 and 32 use the electrically connected terminals 33 to be held on the first surface 4A of the electronic control substrate 4, while standing by themselves. Consequently, in a state where the heat-degradable components 31 and 32 are standing by themselves, when the electronic control device receives vibration as a result of, e.g., vibration of the vehicle body, postures of the heat-degradable components 31 and 32 may change in the housing 10 or soldered portions of the electrically connected terminals 33 may come apart to result in an electric contact failure. Note that the X-direction, the Y-direction, and the Z-direction each illustrated are perpendicular to each other.

Accordingly, in the electronic control device 1 in the present embodiment, as illustrated in FIG. 4, the upper case 2 has supporting region portions 2C and 2D formed so as to contain the heat-degradable components 31 and 32. The supporting region portions 2C and 2D have supporting region top portions 2CT and 2DT facing top portions 31T and 32T of the heat-degradable components 31 and 32 and supporting region side portions 2CS and 2DS facing side portions 31S and 32S of the heat-degradable components 31 and 32. The supporting region top portions 2CT and 2TD are formed to have projecting shapes with respect to the Z-direction to correspond to height dimensions H1 and H2 of the heat-degradable components 31 and 32 of the electronic control substrate 4. The respective heights of the supporting region top portions 2CT and 2DT are larger than respective heights of the heat-dissipating region portions 2A and 2B described above. Note that the supporting region portions 2C and 2D are not limited to having rectangular spaces (see FIG. 2), and may also have, e.g., cylindrical spaces.

On the supporting region top portions 2CT and 2DT at positions on the inner surface 2R of the upper case 2 which face the respective top portions 31T and 32T of the heat-degradable components 31 and 32, supporting members 51 and 52 are formed by being applied or stuck. The supporting members 51 and 52 are brought into close contact with the respective top portions 31T and 32T of the heat-degradable components 31 and 32. Note that the supporting members 51 and 52 may also be applied or stuck to the respective top portions 31T and 32T of the heat-degradable components 31 and 32, or may also be applied or stuck to both of the respective top portions 31T and 32T of the heat-degradable components 31 and 32 and the respective supporting region top portions 2CT and 2DT of the upper case 2. In other words, the supporting members 51 and 52 are provided to be interposed between the respective top portions 31T and 32T of the heat-degradable components 31 and 32 and the supporting region top portions 2CT and 2DT of the upper case 2.

Consequently, the top portions 31T and 32T of the heat-degradable components 31 and 32 among the components that require vibration countermeasures are supported with respect to the supporting region top portions 2CT and 2DT of the upper case 2 via the supporting members 51 and 52. In other words, the top portions 31T and 32T present at positions relatively distant from positions at which the electrically connected terminals 33 are connected by soldering to the electronic control substrate 4 are supported with respect to the inner surface 2R of the upper case 2 via the supporting members 51 and 52. As a result, even when there is, e.g., vibration of the vehicle body, the heat-degradable components 31 and 32 are supported between the upper case 2 and the electronic control substrate 4 and suppressed from moving. Therefore, it is possible to improve vibration resistance of the heat-degradable components 31 and 32, keep the posture of each of the heat-degradable components 31 and 32 from changing, and keep the soldered portion of each of the electrically connected terminals 33 from coming apart to result in an electric contact failure.

Note that the supporting members 51 and 52 need not necessarily be in close contact with the heat-degradable components 31 and 32 as long as it is possible to support the heat-degradable components 31 and 32 when the mounting object 200 such as, e.g., the vehicle body or the engine vibrates and suppress breakage of the electrically connected terminals 33 or the like. In other words, the supporting members 51 and 52 need not necessarily be provided to be interposed between the heat-degradable components 31 and 32 and the upper case 2. It is sufficient as long as the supporting members 51 and 52 are disposed between the heat-degradable components 31 and 32 and the upper case 2 to support the heat-degradable components 31 and 32 when the mounting object 200 vibrates, and can prevent breakage of the electrically connected terminals 33 or the like.

The supporting members 51 and 52 may also be formed by being applied or stuck to the supporting region side portions 2CS and 2DS at positions facing the side portions 31S and 32S of the heat-degradable components 31 and 32. Alternatively, the supporting members 51 and 52 may also be applied or stuck to the respective side portions 31S and 32S of the heat-degradable components 31 and 32, or may also be applied or stuck to both of the respective side portions 31S and 32S of the heat-degradable components 31 and 32 and the respective supporting region side portions 2CS and 2DS of the upper case 2. In this case also, the supporting members 51 and 52 need not necessarily be provided to be interposed between the heat-degradable components 31 and 32 and the upper case 2. It is sufficient as long as the supporting members 51 and 52 are disposed between the heat-degradable components 31 and 32 and the upper case 2 to support the heat-degradable components 31 and 32 when the mounting object 200 vibrates, and can prevent breakage of the electrically connected terminals 33 or the like.

As a result, movement of the supporting members 51 and 52 in the X-direction and the Y-direction is restrained by the supporting region side portions 2CS and 2DS of the upper case 2 via the supporting members 51 and 52, and therefore it is also possible to reliably suppress vibration of the heat-degradable components 31 and 32 in the X-direction and in the Y-direction. Moreover, since the space in which the supporting members 51 and 52 are disposed can be reduced in size by the supporting region side portions 2CS and 2DS and the supporting region top portions 2CT and 2DT of the upper case 2, an amount of use of the supporting members 51 and 52 can be reduced.

Among the components that require vibration countermeasures, the electronic components (heat-degradable components) that undergo heat degradation, such as, e.g., an electrolytic capacitor, encounter the following problem. Specifically, as described above, the heat generated from the heat-generating components 21, 22, and 23 during operation is transmitted to the upper case 2 through the heat-dissipating members 41, 42, and 43 to be diffused therein. Consequently, the heat diffused in the upper case 2 may be transmitted to the heat-degradable components 31 and 32 via the upper case 2 and the supporting members 51 and 52. When the heat generated from the heat-generating components 21, 22, and 23 is transmitted to the heat-degradable components 31 and 32, the heat-degradable components 31 and 32 may undergo heat degradation.

Accordingly, in the electronic control device 1 according to the present embodiment, to prevent the heat degradation of the heat-degradable components 31 and 32, Conditional Expression (1) related to heat conductivities shown below is satisfied. Specifically, the heat conductivity of the heat-dissipating members 41, 42, and 43 is higher than the heat conductivity of the supporting members 51 and 52. In other words, the heat-dissipating members 41, 42, and 43 are more likely to transmit heat than the supporting members 51 and 52. Conversely, the supporting members 51 and 52 are less likely to transmit heat than the heat-dissipating members 41, 42, and 43.

Heat Conductivity of Heat-Dissipating Members 41,42, and 43>Heat Conductivity of Supporting Members 51 and 52    Expression (1).

According to Conditional Expression (1) related to heat conductivities, the heat generated from the heat-generating components 21, 22, and 23 during operation is transmitted to the upper case 2 through the heat-dissipating members 41, 42, and 43 to be diffused therein, while the heat diffused in the upper case 2 is kept from being transmitted to the heat-degradable components 31 and 32 via the supporting members 51 and 52. Therefore, it is possible to suppress the heat degradation of the heat-degradable components 31 and 32.

Examples of a material of the supporting members 51 and 52 include silicone and the like. The heat conductivity of the supporting members 51 and 52 is, e.g., not less than about 0.2 W/m·K and not more than about 0.6 W/m·K. Note that the heat conductivity of the supporting members 51 and 52 is not limited to a value of not less than about 0.2 W/m·K and not more than about 0.6 W/m·K.

Note that, as illustrated by way of example in FIG. 4, on a second surface 4B side of the electronic control substrate 4, heat-generating components 24 may also be mounted. The heat-generating components 24 in the present embodiment are an example of a "second heat-generating component" in the present invention. For example, when the heat-generating components 24 are mounted on the second surface 4B side of the electronic control substrate 4, heat-dissipating members 60 are provided on the heat-generating components 24 by being applied or stuck thereto. The heat-dissipating members 60 in the present embodiment are an example of a "second heat-dissipating member" in the present invention. As a result of additionally providing the heat-dissipating members 60 on the heat-generating components 24, heat generated from the heat-generating components 24 is transmitted via the heat-dissipating members 60 to the electronic control substrate 4 and the upper case 2 to be diffused therein or diffused by radiation via the heat-dissipating members 60. As a result, even when the heat-generating components 21, 22, 23, and 24 are mounted on both of the first surface 4A and the second surface 4B of the electronic control substrate 4, it is possible to efficiently dissipate the heat generated from the heat-generating components 21, 22, 23, and 24.

For example, a material of the heat-dissipating members 60 is the same as the material of the heat-dissipating members 41, 42, and 43. In this case, it is possible to reduce the types of the heat-dissipating members to unify the types of the heat-dissipating members, and simplify a process of producing the electronic control device 1.

<Sealing Agent 5>

The sealing agent 5 illustrated in FIG. 3 is elastically deformable and disposed between the upper case 2 and the lower case 3. As illustrated in FIG. 4, to protect the electronic control substrate 4, the sealing agent 5 bonds the upper case 2 and the lower case 3 together and exhibits dust-proofness, water-proofness, vibration resistance, and the like to liquid-tightly seal or hermetically seal the electronic control substrate 4. The sealing agent 5 is made of, e.g., silicone or the like. The sealing agent 5 may also be formed by applying silicone or the like to at least either of the upper case 2 and the lower case 3 or may also be formed in advance as a substantially quadrilateral frame-shaped member. The "sealing agent" is referred to also as a "sealing material". For example, when the electronic control device 1 is mounted in an engine room of the vehicle, the sealing agent 5 protects the electronic control substrate 4 and the various electronic components of the electronic control device 1 not only from moisture and dust, but also from an exhaust gas, a combustion gas ($SO_2$), and the like in the engine room. Thus, it is possible to avoid a failure of the electronic control device 1.

As illustrated in FIGS. 2 and 4, the upper case 2 has a groove portion 28. The groove portion 28 of the upper case 2 holds the sealing agent 5. When the sealing agent 5 is formed by, e.g., applying silicone or the like, the groove portion 28 of the upper case 2 functions as a reservoir for the sealing agent 5 to be able to keep the sealing agent 5 from protruding or projecting from between the upper case 2 and the lower case 3. Meanwhile, when the sealing agent 5 is formed in advance as the substantially quadrilateral frame-shaped member, the groove portion 28 of the upper case 2 functions as a portion to be engaged with the sealing agent 5 to be able to hold the sealing agent 5.

For example, a material of the sealing agent 5 is the same as the material of the supporting members 51 and 52. In this case, it is possible to reduce the types of the members to unify the types of the members, and simplify a process of producing the electronic control device 1.

As described heretofore, in the electronic control device 1 according to the present embodiment, the heat-degradable components 31 and 32 that require vibration countermeasures and also undergo heat degradation are supported by the supporting members 51 and 52 provided between the heat-degradable components 31 and 32 and the upper case 2. The heat generated from the heat-generating components 21, 22, and 23 is transmitted to the metallic upper case 2 via the heat-dissipating members 41, 42, and 43 each provided on at least any of the heat-generating components 21, 22, and 23 and the upper case 2 to be diffused therein. It is to be noted herein that the heat conductivity of the heat-dissipating members 41, 42, and 43 is higher than the heat conductivity of the supporting members 51 and 52. As a result, even when the heat generated from the heat-generating components 21, 22, and 23 is transmitted to the metallic upper case 2 via the heat-dissipating members 41, 42, and 43 to be diffused therein, the supporting members 51 and 52 can suppress the heat transmitted to the upper case 2 from being transmitted to the heat-degradable components 31 and 32 and also support the heat-degradable components 31 and 32. Therefore, the present electronic control device 1 can suppress the heat degradation of the heat-degradable components 31 and 32 that require vibration countermeasures and also undergo heat degradation, while improving the vibration resistance of the heat-degradable components 31 and 32.

In addition, the upper case 2 in the present embodiment can allow the heat generated from the heat-generating components 21, 22, and 23 to be diffused and dissipated, and can also support the heat-degradable components 31 and 32 that require vibration countermeasures via the supporting members 51 and 52. This allows the lower case 3 to have a function of a lid covering the electronic control substrate 4. Therefore, it is possible to relatively simplify the structure of the lower case 3 and also simplify an outer shape of the electronic control device 1.

Since the heat-dissipating members 41, 42, and 43 are provided to be interposed between the heat-generating components 21, 22, and 23 and the upper case 2, the heat-dissipating members 41, 42, and 43 can reliably transmit the heat generated from the heat-generating components 21, 22, and 23 during operation to the upper case 2 and diffuse the heat therein, and can more reliably dissipate the heat from the heat-generating components 21, 22, and 23. Since the supporting members 51 and 52 are provided to be interposed between the heat-degradable components 31 and 32 and the upper case 2, the supporting members 51 and 52 further suppress the heat diffused in the upper case 2 from being transmitted to the heat-degradable components 31 and 32 that require vibration countermeasures and also undergo heat degradation, while supporting the heat-degradable components 31 and 32 by using the upper case 2, and can more reliably suppress the heat degradation of the heat-degradable components 31 and 32.

Additionally, as described above, the electronic control device 1 according to the present embodiment is attached to the mounting object 200 such as the vehicle body of the vehicle or the engine. When attached to at least either of the engine of the vehicle and the vehicle body in which the engine is mounted, the electronic control device 1 according to the present embodiment can suppress the heat degradation of the heat-degradable components 31 and 32 that require vibration countermeasures and also undergo heat degradation, while improving the vibration resistance of the heat-degradable components 31 and 32. This can improve durability and reliability of the in-vehicle electronic control device 1. In addition, as described above, when the electronic control device 1 is fastened using the bolts 201 to the mounting object 200, the surfaces 152 of the attached portions 15 of the upper case 2 are brought into contact with the surface 205 of the mounting object 200, while occupying a relatively large area. This allows the heat transmitted from the heat-generating components 21, 22, and 23 to the upper case 2 via the heat-dissipating members 41, 42, and 43 to be efficiently transmitted from the attached portions 15 of the upper case 2 to the mounting object 200 to be dissipated therein. Additionally, since the electronic control device 1 is stably attached to the mounting object 200 at the surfaces 152 of the attached portions 15 of the upper case 2, while occupying a relatively large area, it is possible to keep the electronic control device 1 from vibrating.

Hereinabove, the embodiment of the present invention has been described. However, the present invention is not limited to the embodiment described above, and various changes can be made without departing from the scope of the claims. The components in the embodiment described above may be partially omitted or arbitrarily combined with each other to be different from those described above.

For example, the electronic control device 1 can be used for an application other than an in-vehicle application. The illustrated shapes of the upper case 2 and the lower case 3, the illustrated shape of the electronic control substrate 4, the types and numbers of the mounted electronic components and the like are only exemplary, and can arbitrarily be changed.

REFERENCE SIGNS LIST

1 Electronic control device
2 Upper case
2A, 2B Heat-dissipating region portion
2C, 2D Supporting region portion
2CS, 2DS Supporting region side portion
2CT, 2DT Supporting region top portion
2R Inner surface
3 Lower case
4 Electronic control substrate
4A First surface
4B Second surface
4C, 4D Connector
5 Sealing agent
10 Housing
15 Attached portion
21, 22, 23, 24 Heat-generating component
28 Groove portion
31 Heat-degradable component
31S Side portion
31T Top portion
32 Heat-degraded component
32S Side portion
32T Top portion
33 Electrically connected terminal
41, 42, 43 Heat-dissipating member
48 Bolt through hole
51, 52 Supporting member
60 Heat-dissipating member
151 Bolt through hole
152 Surface
200 Mounting object
201, 202 Bolt
205 Surface
221 Bolt
222 Bolt through hole
223, 224 Female screw portion
H1, H2 Height dimension

The invention claimed is:

1. An electronic control device with heat-dissipating members and supporting members comprising:
a circuit board having a first surface on which a heat-generating component that generates heat during operation and a plurality of heat-degradable components that requires vibration countermeasures and undergoes heat degradation are mounted, the heights of the plurality of heat-degradable components being different from each other;
a first metallic case covering the first surface;
a second case covering a second surface of the circuit board opposite to the first surface;
a supporting member provided between the heat-degradable component and the first case to support the heat-degradable component; and
a heat-dissipating member provided on at least either of the heat-generating component and the first case to transmit the heat generated from the heat-generating component to the first case,
the first case having a plurality of supporting region portions formed so as to contain the plurality of heat-degradable components integrally,
the supporting region portion having a supporting region top portion facing a top portion of the heat-degradable component,
the supporting region top portion being formed to have a projecting shape with respect to a height direction to correspond to each height of the plurality of heat-degradable components,
the supporting member being disposed only between the top portion of each of the plurality of heat-degradable components and the supporting region top portion and disposed away from the heat- dissipating member through space, and
a heat conductivity of the heat-dissipating member being higher than a heat conductivity of the supporting member.

2. The electronic control device according to claim 1, wherein the heat-dissipating member is provided to be interposed between the heat-generating component and the first case.

3. The electronic control device according to claim 1, further comprising:
a sealing agent disposed between the first case and the second case to bond the first case and the second case together and liquid-tightly seal the circuit board between the first case and the second case, wherein
a material of the sealing agent is the same as a material of the supporting member.

4. The electronic control device according to claim 1, wherein the heat-generating component is a first heat-generating component, and the heat-dissipating member is a first heat-dissipating member, the electronic control device further comprising:

a second heat-generating component mounted on the second surface to generate heat during operation; and a second heat-dissipating member additionally provided on the second heat-generating component to dissipate heat generated from the second heat-generating component.

5. The electronic control device according to claim 1, wherein the circuit board is used to control operation of an engine of a vehicle, and the first case is attached to at least either of the engine and a vehicle body in which the engine is mounted.

6. The electronic control device according to claim 5, wherein the first case is attached using a fastening member to at least either of the engine and the vehicle body to have a surface thereof brought into contact with a surface of at least either of the engine and the vehicle body.

\* \* \* \* \*